United States Patent [19]

Yokoyama

[11] Patent Number: 4,651,106

[45] Date of Patent: Mar. 17, 1987

[54] MULTIPLEX STEREO DEMODULATOR

[75] Inventor: Kenji Yokoyama, Hamamatsu, Japan

[73] Assignee: Nippon Gakki Seizo Kabushiki Kaisha, Hamamatsu, Japan

[21] Appl. No.: 824,061

[22] Filed: Jan. 30, 1986

[30] Foreign Application Priority Data

Feb. 6, 1985 [JP] Japan .................................. 60-21526

[51] Int. Cl.$^4$ .......................... H03D 1/02; H04H 5/00
[52] U.S. Cl. ...................................... 329/50; 329/103; 329/112; 329/122; 329/126; 381/3
[58] Field of Search ................. 329/50, 101, 103, 110, 329/112, 122, 124, 126; 381/2, 3, 7, 8

[56] References Cited

U.S. PATENT DOCUMENTS 4,035,585 7/1977 Ogita ........................................ 381/8
4,560,942 12/1985 Janta et al. ........................... 329/101

Primary Examiner—Siegfried H. Grimm
Attorney, Agent, or Firm—Spensley Horn Jubas & Lubitz

[57] ABSTRACT

A stereo demodulator capable of demodulating a composite signal without performing a switching operation is disclosed. A subcarrier generating circuit generates a square wave subcarrier signal V1 of 38 KHz which is in turn converted into a triangular wave subcarrier signal V4 of 38 KHz synchronized with the square wave subcarrier signal V1. The composite signal is converted into a current signal i which is then amplified by a voltage-controlled amplifier whose gain varies in accordance with the triangular wave subcarrier signal V4 applied thereto as a control voltage. Since the voltage-controlled amplifier is of such a type that the gain thereof logarithmically varies in accordance with the control voltage, the composite signal is amplified by a gain which varies substantially sinusoidally in accordance with the triangular wave subcarrier signal V4. As an output of the voltage-controlled amplifier is in the form of a pair of currents $i_R$ and $i_L$ which vary complementarily to each other, the signals represent right and left channel signals.

7 Claims, 8 Drawing Figures

MULTIPLEX STEREO DEMODULATOR

BACKGROUND OF THE INVENTION

1. Field of the Invention

This invention relates to a multiplex stereo demodulator for use in an FM radio receiver.

2. Prior Art

Conventionally, there have been proposed two types of multiplex stereo demodulators for use in FM radio receivers, one of which is an analog multiplication type demodulator and the other of which is a switching type demodulator.

The analog multiplication type demodulator comprises, as shown in FIG. 1, a subcarrier generating circuit 10 which generates sinusoidal subcarrier signals $S_1$ and $\bar{S}_1$ both of 38 KHz in accordance with a pilot signal contained in a composite signal applied to an input terminal 11. These sinusoidal subcarrier signals $S_1$ and $\bar{S}_1$ are supplied respectively to analog multipliers 12 and 13 to be multiplied by the composite signal, whereby left channel and right channel audio signals are obtained at output terminals $L_{CH}$ and $R_{CH}$, respectively. This type of demodulator is disadvantageous in that it is significantly difficult to obtain sinusoidal subcarrier signals precisely synchronized with each other, so that the channel separation is liable to be deteriorated due to the occurrence of the phase shift (non-synchronization) of the sinusoidal subcarrier signals.

The switching type demodulator comprises, as shown in FIG. 2, a subcarrier generating circuit 20 which generates square wave subcarrier signals $\phi$ and $\bar{\phi}$ both of 38 KHz in accordance with a pilot signal contained in a composite signal applied to an input terminal 21. These square wave subcarrier signals $\phi$ and $\bar{\phi}$ are supplied respectively to transistors Qa and Qb to alternately conduct them, whereby a left channel audio signal and a right channel audio signal are obtained at output terminals L and R, respectively. This type of stereo demodulator is simpler in construction than the aforesaid analog multiplication type demodulator but is disadvantageous in the following respects: (1) Circuits disposed on the periphery of the demodulator are subjected to radiation of higher harmonics of the subcarrier signals which is due to the switching operation in the demodulator performed in accordance with the square wave subcarrier signals; (2) Noises contained in the composite signal and having frequencies corresponding to the higher harmonics of the 38-KHz subcarrier signals (i.e., 114 KHz, 190 KHz and so on) can be demodulated by the switching operation performed in accordance with the 38-KHz square wave subcarrier signals. The demodulated higher harmonics cause an interference due to their beats; and (3) High-speed circuit elements for effecting the switching operation are needed.

SUMMARY OF THE INVENTION

It is therefore an object of the present invention to provide a stereo demodulator for use in an FM radio receiver in which radiation of higher harmonics of the subcarrier signals to its peripheral circuits can be minimized.

It is another object of the invention to provide such a stereo demodulator which can minimize the deterioration of the channel separation due to a phase shift (error) of the subcarrier signals.

It is a further object of the invention to provide such a stereo demodulator which can eliminate a beat interference due to the higher harmonics of the subcarrier signals.

It is a still further object of the invention to provide such a stereo demodulator which can obviate the need for high speed switching devices.

According to an aspect of the present invention, there is provided a stereo demodulator for use in an FM radio receiver having an FM detector for detecting a composite signal comprising a subcarrier generating circuit responsive to the composite signal for generating a triangular wave subcarrier signal synchronized with a subcarrier component of the composite signal; and an operation circuit for amplifying the composite signal at a gain determined by the triangular wave subcarrier signal to output a demodulated signal, the gain varying substantially sinusoidally in accordance with the triangular wave subcarrier signal. dr

DESCRIPTION OF THE PREFERRED EMBODIMENT OF THE INVENTION

Figure 3:
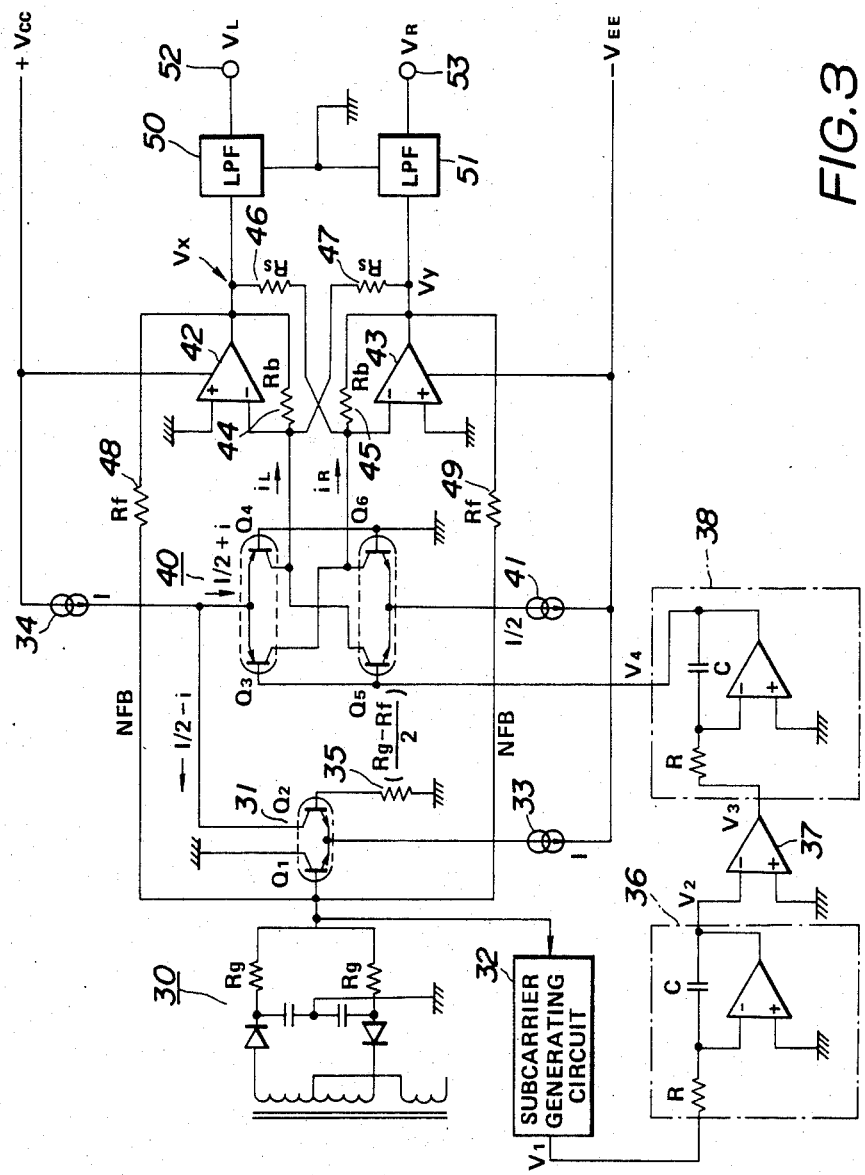
FIG. 3 is a circuit diagram of a stereo demodulator provided in accordance with the present invention.
Figure 4:
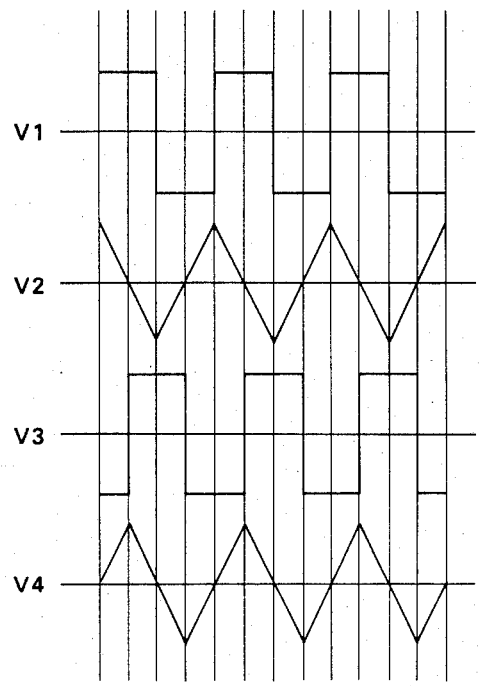
FIG. 4 is an illustration showing the waveforms of the signals V1 to V4 appearing in the circuit of FIG. 3.

Referring now to FIG. 3, there is shown a stereo demodulator provided in accordance with the present invention. In FIG. 3, shown at 30 is a well-known FM detector which detects a composite signal from an output of an intermediate frequency stage (not shown), and supplies the detected composite signal to a voltage-to-current converter (hereinafter referred to as "V/I converter") 31 as well as to a subcarrier generating circuit 32 of the conventional type. The V/I converter 31 comprises two NPN transistors Q1 and Q2 whose emitters are connected to each other, and operates in such a manner that a collector current of the transistor Q2 varies in accordance with a voltage of the composite signal applied to a base of the transistor Q1. The emitters of both transistors Q1 and Q2 are connected through a constant current source 33 of a current I to a voltage source of a voltage $-V_{EE}$, while a collector of the transistor Q2 is connected through a constant current source 34 of a current I to a voltage source of a voltage $+V_{CC}$. A collector of the transistor Q1 is grounded, and a base of the transistor Q2 is connected through a resistor 35 to ground. The subcarrier generating circuit 32 extracts a pilot signal of 19 KHz from the composite signal applied thereto, and generates a square wave subcarrier signal V1 of 38 KHz in accordance with the extracted pilot signal. This subcarrier generating circuit 32 comprises, for example, a phase-locked loop (PLL), so that the generated subcarrier signal V1 is precisely in phase with the subcarrier component of the composite signal. The thus generated subcarrier signal V1 is supplied to an integration circuit 36 which in turn integrates the supplied subcarrier signal to produce a triangular wave signal V2. This triangular wave signal V2 is then converted into a square wave signal V3 by a comparator 37 and fed to an integration circuit 38. The integration circuit 38 integrates the square wave signal V3 to produce a triangular wave subcarrier signal V4. FIG. 4 shows waveforms of the above four signals V1 to V4, from which it will be appreciated that the triangular wave subcarrier signal V4 coincides in phase with the square wave subcarrier signal V1.

Figure 1:
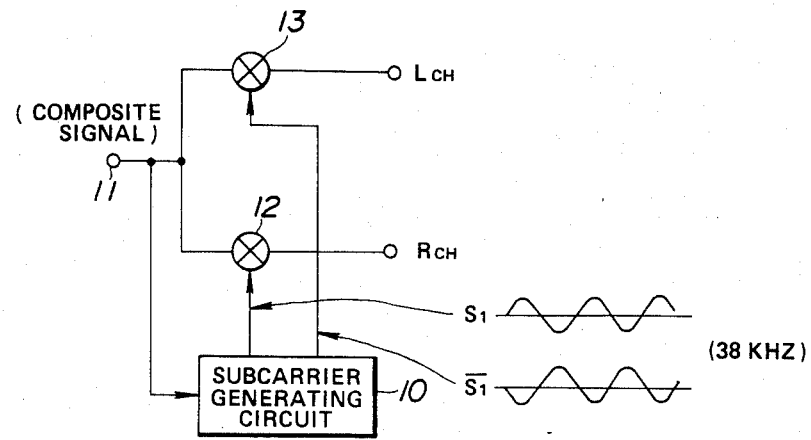
FIG. 1 is a circuit diagram of a conventional analog multiplication type stereo demodulator.
Figure 2:
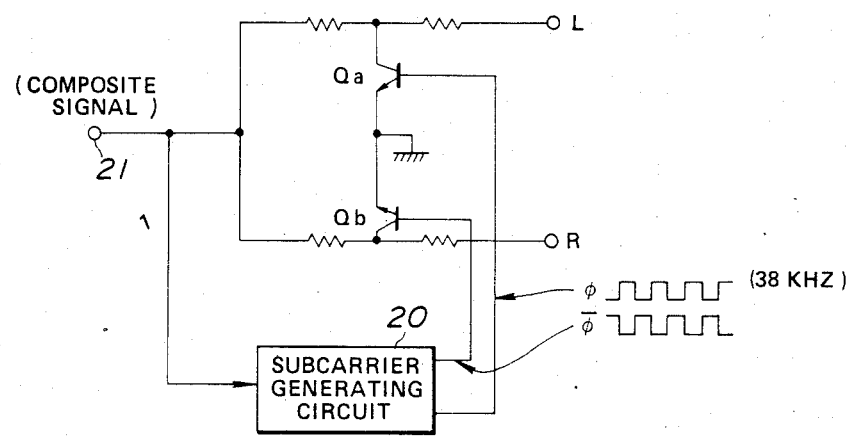
FIG. 2 is a circuit diagram of a conventional switching type stereo demodulator.
Figure 5:
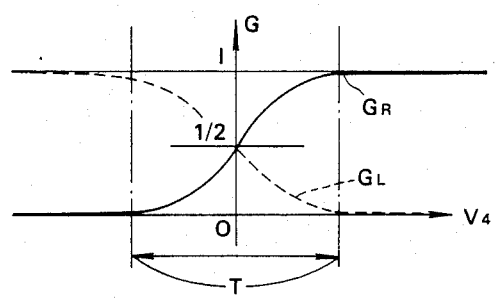
FIG. 5 is an illustration showing the characteristics of the voltage-controlled amplifier 40 of the circuit of FIG. 3.
Figure 6:
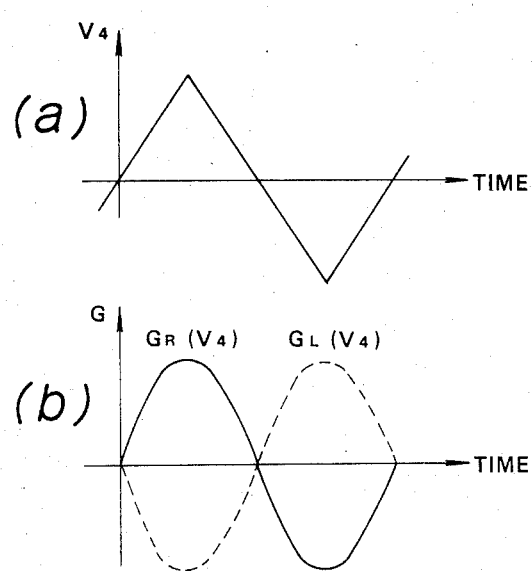
FIG. 6 is an illustration showing how the multiplication of sinusoidal signals is effected in accordance with the triangular wave subcarrier signals.

Referring again to FIG. 3, the collector of the transistor Q2 is connected to emitters of a pair of PNP transistors Q3 and Q4. Collectors of these transistors Q3 and Q4 are connected respectively to collectors of NPN transistors Q6 and Q5 whose emitters are coupled to each other. Both bases of the transistors Q3 and Q5 are supplied with the aforesaid subcarrier signal V4, while the bases of the transistors Q4 and Q6 are both grounded. And, the emitters of the transistors Q5 and Q6 are connected through a constant current source 41 of a current I/2 to the voltage source of the voltage $-V_{EE}$. The two pairs of transistors Q3 and Q4, and Q5 and Q6 constitute a well-known voltage-controlled amplifier 40 which operates in such a manner that a signal current i flowing into the emitters of the pair of transistors Q3 and Q4 is controlled by a voltage of the signal V4 applied to the bases of the transistors Q3 and Q5 to output respectively from the collectors of the transistors Q3 and Q4 two signal currents $i_R$ and $i_L$ expressed by the following equations:

$$i_R = G_R(V4) \cdot i = i/[1+\exp(-KV4)] \quad (1)$$

$$i_L = G_L(V4) \cdot i = i/[1+\exp(KV4)] \quad (2)$$

where, $G_R$ and $G_L$ are gains which vary in accordance with the voltage of the signal V4 as indicated respectively by a solid line and a broken line in FIG. 5. If the amplitude of the triangular wave subcarrier signal V4 shown in FIG. 6-(a) is set to such a value that the signal V4 varies within the voltage range T shown in FIG. 5, the product of $G_R$ and V4 and the product of $G_L$ and V4 form the signals indicated respectively by a solid line and a broken line in FIG. 6-(b) both of which are very close in waveform to a sinusoidal signal. And therefore, the currents $i_R$ and $i_L$ are equivalent to those currents obtained by multiplying the signal current i respectively by sinusoidal subcarrier signals 180° out of phase from each other. Thus, the aforesaid circuit portion of the stereo demodulator of FIG. 3 performs the demodulation of the composite signal in a similar manner to the analog multiplication type demodulator shown in FIG. 1.

The currents $i_L$ and $i_R$ thus obtained are then supplied to inverting input terminals of operational amplifiers 42 and 43, respectively. The operational amplifier 42 cooperates with a resistor 44 of a resistance value Rb connected between the inverting and output terminals thereof to form a current-to-voltage converter, and this is true with the operational amplifier 43 and a resister 45 of a resistance value Rb. Resistors 46 and 47 each having a resistance value Rs are connected between the output terminal of the operational amplifier 42 and the inverting input terminal of the operational amplifier 43 and between the output terminal of the operational amplifier 43 and the inverting input terminal of the operational amplifier 42, respectively. Each of the resistors 46 and 47 causes a predetermined amount or fraction of the demodulated signal of the one channel to be mixed with the demodulation signal of the other channel, thereby enabling the crosstalk between the two channels to be adjusted. Resistors 48 and 49 each having a resistance value of Rf are connected between the output terminal of the operational amplifier 42 and the base of the transistor Q1 and between the output terminal of the operational amplifier 43 and the base of the transistor Q1, respectively. The resistors 48 and 49 cooperate with the V/I converter 31, the voltage-controlled amplifier 40 and the operational amplifiers 42 and 43 to form overall feedback paths of this stereo demodulator, thereby reducing distortion of the demodulated audio signals. Such a feedback path is disclosed, for example, in U.S. Pat. No. 4,035,585.

Signals $V_X$ and $V_Y$ obtained respectively at the output terminals of the operational amplifiers 42 and 43 are then supplied to low-pass filters 50 and 51. These low-pass filters 50 and 51 remove the subcarrier signal components from the signals $V_X$ and $V_Y$ to provide left and right audio signal components $V_L$ and $V_R$ which are then outputted from output terminals 52 and 53, respectively.

The operation of the above-described demodulator will now be more fully described.

When no signal is outputted from the FM detector 30, the constant current sources 33, 34 and 41 cause a current in the amount of I/2 to flow through each of the collectors of the transistors Q1 and Q2. On the other hand, when a composite signal is outputted from the FM detector 30, the collector currents of the transistors Q1 and Q2 complementarily vary in accordance with the voltage of the composite signal applied to the base of the transistor Q1. If the collector current of the transistor Q1 is varied by an amount of i, then the amount of the collector current of the transistor Q2 becomes "I/2−i" as shown in FIG. 3.

The relation between the collector currents Ic3 to Ic6 of the transistors Q3 to Q6 and the currents $i_L$ and $i_R$ will now be described.

Due to the provision of the constant current source 34, a current in the amount of "I/2 +i" flows into the emitters of the transistors Q3 and Q4, while a current in the amount of "I/2" is taken out of the emitters of the transistors Q5 and Q6 by the constant current source 41. For simplicity, the following description will be given as to only three cases where the triangular subcarrier signal V4 is at the positive peak, zero-level and negative peak.

(1) V4 = 0

When the signal V4 is at the zero level, all the voltages at the bases of the transistors Q3 to Q6 are also at the zero level. Consequently, the collector currents Ic3 and Ic4 of the transistors Q3 and Q4 become equal to each other, and the collector currents Ic5 and Ic6 of the transistors Q5 and Q6 also become equal to each other. Thus, the following equations are obtained:

$$Ic3 = Ic4 = (I/2 + i)/2 \quad (3)$$

$$Ic5 = Ic6 = (I/2)/2 \quad (4)$$

And therefore, the respective amounts of the currents $i_L$ and $i_R$ are obtained from the above equations (3) and (4) as follows:

$$i_L = Ic4 - Ic5 = i/2 \qquad (5)$$

$$i_R = Ic3 - Ic6 = i/2 \qquad (6)$$

(2) Positive peak

When the signal V4 is at its positive peak, the transistor Q3 is cut off to give:

$$Ic3 = Ic6 = 0 \qquad (7)$$

Consequently, the following is obtained:

$$Ic4 = (1/2) + i \qquad (8)$$

$$Ic5 = I/2 \qquad (9)$$

And therefore, the currents $i_L$ and $i_R$ become equal to "i" and "0", respectively.

(3) Negative peak

When the signal V4 is at its negative peak, the transistor Q5 is cut off, so that the case is the inversion of the above case (2). And therefore, the currents $i_L$ and $i_R$ become equal to "0" and "i", respectively.

Figure 7:
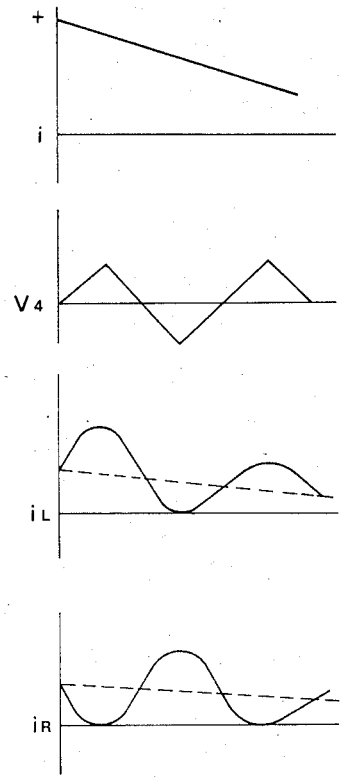
FIG. 7 is an illustration showing one example of the waveforms of the current i, the signal V4 and the currents $i_L$ and $i_R$ appearing in the circuit of FIG. 3.

The foregoing is the relation between the collector currents Ic3 to Ic6 and the currents $I_L$ and $I_R$. FIG. 7 shows one example of the variations of the current i, the triangular subcarrier signal V4 and the currents $i_L$ and $i_R$, wherein the current i is gradually decreased.

As described above, with the arrangement of this embodiment, a triangular wave subcarrier signal is produced by first generating a square wave subcarrier signal from the composite signal and by subsequently integrating the square wave subcarrier signal. And, the thus produced triangular subcarrier signal is supplied to a voltage-controlled amplifier so that a multiplication of a signal current, which corresponds to the composite signal, by sinusoidal subcarrier signals is effected. In this case, the above square subcarrier signal can be precisely synchronized with the subcarrier components of the composite signal by utilizing a well-known PLL or the like. And therefore, the triangular wave subcarrier signal obtained by integrating the square wave subcarrier signal can also be precisely synchronized with the subcarrier components of the composite signal. Thus, the above-described stereo demodulator can demodulate the composite signal into left channel and right channel audio signals having a significantly good channel separation. Also, since no switching operation based on the square wave signal is performed in the signal system of the demodulator, there will be little radiation of the higher harmonics to the peripheral circuits, thereby preventing a beat interference. Furthermore, the circuitry of the signal system in this demodulator only deals with sinusoidal signals, and therefore it does not require high-speed switching devices, so that the costs of this demodulator can be remarkably reduced.

Figure 8:
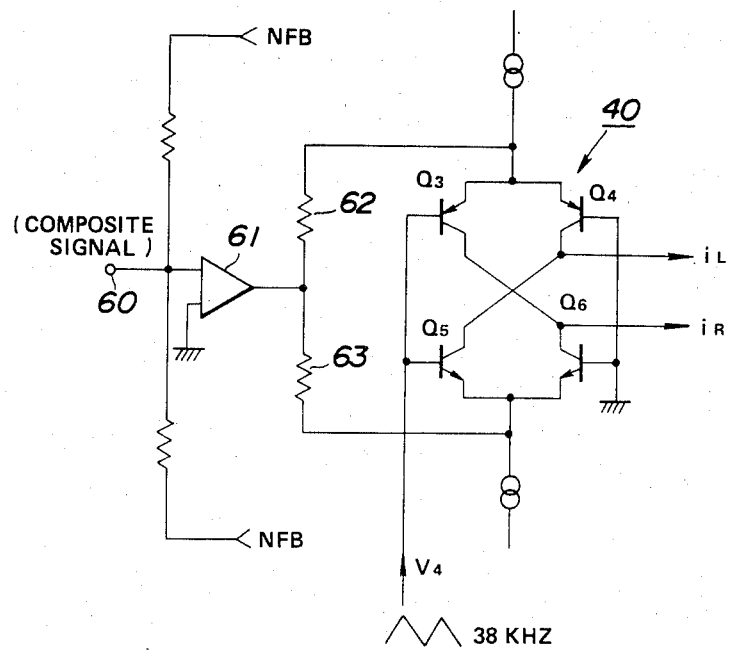
FIG. 8 is a circuit diagram of a modified form of that circuit portion of the demodulator of FIG. 3 which is constituted by the voltage-to-current converter 31 and the voltage-controlled amplifier 40.

FIG. 8 shows a modified form of that circuit portion of the demodulator of FIG. 3 which is constituted by the V/I converter 31 and the voltage-controlled amplifier 40. In FIG. 8, the composite signal applied to a terminal 60 is amplified by an operational amplifier 61 whose output terminal is connected to the emitters of the transistors Q3 and Q4 and to the emitters of the transistors Q5 and Q6 through resistors 62 and 63, respectively. The operation of this circuit is similar to that of the circuit portion shown in FIG. 3.

What is claimed is:

1. A stereo demodulator for use in an FM radio receiver having an FM detector for detecting a composite signal comprising:

(a) subcarrier generating means responsive to the composite signal for generating a triangular wave subcarrier signal synchronized with a subcarrier component of the composite signal, wherein said subcarrier generating means comprises:

a subcarrier generating circuit responsive to the composite signal for extracting a pilot signal of 19 KHz therefrom and for producing a square wave subcarrier signal of 38 KHz in accordance with said extracted pilot signal; and triangular wave signal generating means responsive to said square wave subcarrier signal for generating a triangular wave signal of 38 KHz, said triangular wave signal being said triangular wave subcarrier signal, wherein said 38 KHz square wave subcarrier signal is in phase with said 38 KHz traiangular wave signal generated by said triangular wave generating means, wherein said triangular wave signal generating means comprises:

(i) a first triangular wave signal generating circuit for generating a first triangular wave signal of 38 KHz in accordance with said square wave subcarrier signal outputted from said subcarrier generating circuit, (ii) a square wave signal generating circuit responsive to said first triangular wave signal generated by said first triangular wave signal generating circuit for generating a square wave signal of 38 KHz, and (iii) a second triangular wave signal generating circuit responsive to said square wave signal generated by said square wave signal generating circuit for generating a second triangular wave signal, said second triangular wave signal being said triangular wave subcarrier signal; and (b) operation circuit means for amplifying the composite signal at a gain determined by said traingular wave subcarrier signal to output a demodulated signal, said gain varying substantially sinusoidally in accordance with said traingular wave subcarrier signal, wherein said gain of said operation circuit means varies logarithmically in response to a gain control signal applied thereto, said triangular subcarrier signal being supplied to said operation circuit means as said gain control signal.

2. A stereo demodulator according to claim 1, wherein said operation circuit means comprises:

a voltage-to-current converter for converting a voltage of said composite signal, fed from the FM detector to an input terminal of said voltage-to-current converter, into a current; and a voltage-controlled amplifier for amplifying said current fed from said voltage-to-current converter at a gain determined by a voltage of said triangular wave subcarrier signal to output an amplified signal of said current as said demodulated signal, said gain of said voltage-controlled amplifier logarithmically varying in accordance with said voltage of said triangular wave subcarrier signal, said voltage-controlled amplifier outputting a pair of complementarily varying signals as said amplified signal, said complementarily varying signals being left and right channel signals contained in the composite signal.

3. A stereo demodulator according to claim 2, wherein said operation circuit means further comprises a negative feedback circuit means for feeding fractions of said left and right channel signals back to said input terminal of said voltage-to-current converter means.

4. A stereo demodulator for use in an FM radio receiver having an FM detector for detecting a composite signal comprising:
   (a) subcarrier generating means responsive to the composite signal for generating a triangular wave subcarrier signal synchronized with a subcarrier component of the composite signal; and
   (b) operation circuit means for amplifying the composite signal at a gain determined by said triangular wave subcarrier signal to output a demodulated signal, said gain varying substantially sinusoidally in accordance with said triangular wave subcarrier signal, wherein said gain of said operation circuit means varies logarithmically in response to a gain control signal applied thereto, said triangular subcarrier signal being supplied to said operation circuit means as said control signal, wherein said operation circuit means comprises:
      a voltage-to-current converter for converting a voltage of said composite signal, fed from the FM detector to an input terminal of said voltage-to-current converter, into a current;
      a voltage-controlled amplifier for amplifying said current fed from said voltage-to-current converter at a gain determined by a voltage of said triangular wave subcarrier signal to output an amplified signal of said current as said demodulated signal, said gain of said voltage-controlled amplifier logarithmically varying in accordance with said voltage of said triangular wave subcarrier signal, said voltage-controlled amplifier outputting a pair of complementarily varying signals as said amplified signal, said complementarily varying signals being left and right channel signals contained in the composite signal; and
      a negative feedback circuit means for feeding fractions of said left and right channel signals back to said input terminal of said voltage-to-current converter means.

5. A stereo demodulator according to claim 4, wherein said subcarrier generating means comprises:
   a subcarrier generating circuit responsive to the composite signal for extracting a pilot signal of 19 KHz therefrom and for producing a square wave subcarrier signal of 38 KHz in accordance with said extracted pilot signal; and
   triangular wave signal generating means responsive to said square wave subcarrier signal for generating a triangular wave signal of 38 KHz, said triangular wave signal being said triangular wave subcarrier signal.

6. A stereo demodulator according to claim 5, wherein said 38 KHz square wave subcarrier signal is in phase with said 38 KHz triangular wave signal generated by said triangular wave generating means.

7. A stereo demodulator according to claim 6, wherein said triangular wave signal generating means comprises:
   a first triangular wave signal generating circuit for generating a first triangular wave signal of 38 KHz in accordance with said square wave subcarrier signal outputted from said subcarrier generating circuit;
   a square wave signal generating circuit responsive to said first triangular wave signal generated by said first triangular wave signal generating circuit for generating a square wave signal of 38 KHz; and
   a second triangular wave signal generating circuit responsive to said square wave signal generated by said square wave signal generating circuit for generating a second triangular wave signal, said second triangular wave signal being said triangular wave subcarrier signal.

* * * * *